(12) United States Patent
Orita et al.

(10) Patent No.: US 6,499,119 B1
(45) Date of Patent: Dec. 24, 2002

(54) DATA INSPECTION METHOD AND APPARATUS

(75) Inventors: Suehiro Orita, Kawasaki (JP); Masao Kobori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/455,372

(22) Filed: Dec. 6, 1999

(30) Foreign Application Priority Data

May 6, 1999 (JP) .......................................... 11-126102

(51) Int. Cl.[7] ............................................... G11C 29/00
(52) U.S. Cl. ...................................................... 714/719
(58) Field of Search ................................ 714/718, 719, 714/720, 723, 734, 735, 736, 739, 743, 799, 809, 811, 818, 819, 824, FOR 290

(56) References Cited

U.S. PATENT DOCUMENTS 5,222,066 A  *  6/1993  Grula et al. ................ 714/718
5,925,142 A  *  7/1999  Raad et al. ................ 714/718
6,134,690 A  * 10/2000  Ivaturi et al. ................ 714/46

FOREIGN PATENT DOCUMENTS

JP          3-244043           10/1991
JP          5-35532            2/1993

* cited by examiner

*Primary Examiner*—Albert Decady
*Assistant Examiner*—Matthew Dooley
(74) *Attorney, Agent, or Firm*—Staas & Halsey LLP (57) ABSTRACT

A data inspection method includes the steps of (a) writing original test data in a memory region, (b) reading the test data from the memory region, and (c) comparing the read test data with the original test data, so as to make a data inspection. The test data is formed by a plurality of cell data. Each of the cell data includes a delimiter indicating a boundary between two adjacent cell data, a cell number indicating an order within the test data, a cell data length indicating a data length of the cell data, and pattern data. Each of the cell data in the test data has a cell data length which is variable.

11 Claims, 8 Drawing Sheets

| DELIMITER 10 | CELL No. 12 | CELL DATA LENGTH 14 | PATTERN DATA 18 | | | | |
|---|---|---|---|---|---|---|---|
| FEFE | 0001 | 0010 | 0102 | 0304 | 0506 | 0708 | 090A |
| FEFE | 0002 | 0010 | 0203 | 0405 | 0607 | 0809 | 0A0B |
| FEFE | 0003 | 0010 | 0304 | 0506 | 0708 | 090A | 0B0C |
| .. | .. | | | | | | |

| ITEM | DELIMITER | CELL NO. | CELL DATA LENGTH | DATA COMPARISON | OTHER CONDITIONS | RECOGNITION RESULT |
|---|---|---|---|---|---|---|
| | | | | | | |
| 1 | OK | OK | OK | OK | | NORMAL |
| | OK | OK | OK | NG | | DATA ABNORMAL |
| | OK | OK | NG | OK | | DATA LENGTH ABNORMAL |
| | OK | OK | NG | NG | | DATA & DATA LENGTH ABNORMAL |
| | OK | NG | | | | |
| | OK | LARGER THAN ANTICIPATED VALUE | OK | — | ANTICIPATED VALUE FOLLOWING | CELL SWITCHING |
| | OK | LARGER THAN ANTICIPATED VALUE | OK | — | NO ANTICIPATED VALUE FOLLOWING | CELL DROPOUT |
| | OK | SMALLER THAN ANTICIPATED VALUE | OK | — | SAME VALUE PRECEDING | CELL OVERLAP |
| | OK | SMALLER THAN ANTICIPATED VALUE | OK | — | NO SAME VALUE PRECEDING | CELL SWITCHING |
| | OK | IMPOSSIBLE VALUE | OK | — | | PROGRAM ABNORMAL |
| | NG | OK | OK | OK | | DELIMITER ABNORMAL |
| | NG | OK | OK | NG | | DELIMITER & DATA ABNORMAL |
| | NG | OK | NG | OK | | DELIMITER & CELL LENGTH ABNORMAL |
| | NG | OK | NG | NG | | DELIMITER & CELL LENGTH & DATA ABNORMAL |
| | NG | NG | OK | OK | | DELIMITER & CELL NO. ABNORMAL |
| | NG | NG | OK | NG | | DELIMITER & CELL NO. & DATA ABNORMAL |
| | NG | NG | NG | OK | | DELIMITER & CELL NO. & CELL LENGTH ABNORMAL |
| | NG | NG | NG | NG | FORWARD CELL SEARCH | |
| | NG | NG | NG | — | SEARCH SUCCESSFUL | DATA DROPOUT (INSPECTED) |
| | NG | NG | NG | — | SEARCH FAILED | IMPOSSIBLE (INSPECTED) |
| | NG | NG | NG | — | BACKWARD CELL SEARCH | |
| | NG | NG | NG | — | SEARCH SUCCESSFUL | DATA MIXING TO NEXT CELL POSITION |
| | NG | NG | NG | — | SEARCH FAILED | DATA ABNORMAL AFTER DETECTED POSITION |

FIG. 8

DATA INSPECTION METHOD AND APPARATUS

BACKGROUND OF THE INVENTION

1. Field of the Invention

The present invention generally relates to data inspection methods and apparatuses, and more particularly to a data inspection method and a data inspection apparatus for inspecting data which are written and read by an information processing apparatus.

2. Description of the Related Art

Conventionally, a storage medium such as a semiconductor memory and a storage device, and a peripheral device of an information processing apparatus are tested by writing test data to a write address of the storage medium. The test data written in the storage medium is read from the same address as the write address, and a data inspection is made by comparing the read test data and the test data.

The conventional test data has a value which is represented by a predetermined number of bits, such as 16 bits. The value of the test data continuously increases or decreases. That is, the test data is made up of a continuous data which continuously increases or decreases.

According to the continuous data which is conventionally used as the test data, it is possible to detect a fault when the test data written at a certain address and the test data read from this certain address differ. However, there was a problem in that it takes an extremely long time in order to detect a range of the fault and to determine the type of fault. This is because a complex logic system is required to determine if the fault is caused by a data dropout, data overlap or duplication, data mixing, data transformation or the like. The determination of the data mixing involves detection of a location where the data is mixed, and the determination of the data transformation involves detection of a location where a data "1" is transformed into a data "0", for example.

In addition, when the information processing apparatus makes a write access to the external storage device, such as a hard disk drive, the following operations are involved. In terms of hardware, the write access starts from reading data from the semiconductor memory. The data read from the semiconductor memory are transferred to a channel input/output controller via an internal bus and a cache within a CPU, and the data are transferred from the channel input/output controller to the external storage device via an external bus and an input/output controller. The data transferred to the external storage device are written into a storage medium in logical blocks. When the operations described above are carried out by use of an operating system (OS), further processes of the OS are required, such as paging, and conversion between logical blocks and physical blocks. Therefore, even if the fault is detected by use of the continuous data, there was a problem in that it is extremely difficult to specify the exact location where the fault is generated.

SUMMARY OF THE INVENTION

Accordingly, it is a general object of the present invention to provide a novel and useful data inspection method and data inspection apparatus, in which the problems described above are eliminated.

Another and more specific object of the present invention is to provide a data inspection method and a data inspection apparatus which can specify a location of a fault when the fault is detected, and determine the kind of fault by a simple logic system.

Still another object of the present invention is to provide a data inspection method comprising the steps of (a) writing original test data in a memory region, (b) reading the test data from the memory region, and (c) comparing the read test data with the original test data, so as to make a data inspection, where the test data is formed by a plurality of cell data, each of the cell data includes a delimiter indicating a boundary between two adjacent cell data, a cell number indicating an order within the test data, a cell data length indicating a data length of the cell data, and pattern data, and each of the cell data in the test data has a cell data length which is variable. According to the data inspection method of the present invention, it is possible to specify the location of a fault generated in the cell data based on the cell data length of the cell data, because the cell data length of each cell data is variable.

A further object of the present invention is to provide the above data inspection method which further comprises the steps of (d) recognizing a cell data dropout, a cell data overlap or a cell data switching based on a size relationship of a cell number of the cell data in the read test data and an anticipated cell number, and whether or not the read test data includes a cell data having the anticipated cell number, if the cell number of the cell data in the read test data differs from a cell number of the cell data in the original test data. According to the data inspection method of the present invention, it is possible to recognize the kind of fault.

Another object of the present invention is to provide a data inspection apparatus which makes a data inspection by writing original test data in a memory region, reading the test data from the memory region, and comparing the read test data with the original test data, comprising test data generating means for generating the test data from a plurality of cell data, where each of the cell data includes a delimiter indicating a boundary between two adjacent cell data, a cell number indicating an order within the test data, a cell data length indicating a data length of the cell data, and pattern data, and each of the cell data in the test data has a cell data length which is variable. According to the data inspection apparatus of the present invention, it is possible to specify the location of a fault generated in the cell data based on the cell data length of the cell data, because the cell data length of each cell data is variable.

Still another object of the present invention is to provide the above data inspection apparatus which further comprises recognizing means for recognizing a cell data dropout, a cell data overlap or a cell data switching based on a size relationship of a cell number of the cell data in the read test data and an anticipated cell number, and whether or not the read test data includes a cell data having the anticipated cell number, if the cell number of the cell data in the read test data differs from a cell number of the cell data in the original test data. According to the data inspection apparatus of the present invention, it is possible to recognize the kind of fault.

Other objects and further features of the present invention will be apparent from the following detailed description when read in conjunction with the accompanying drawings.

DESCRIPTION OF THE PREFERRED EMBODIMENTS

Figure 1:
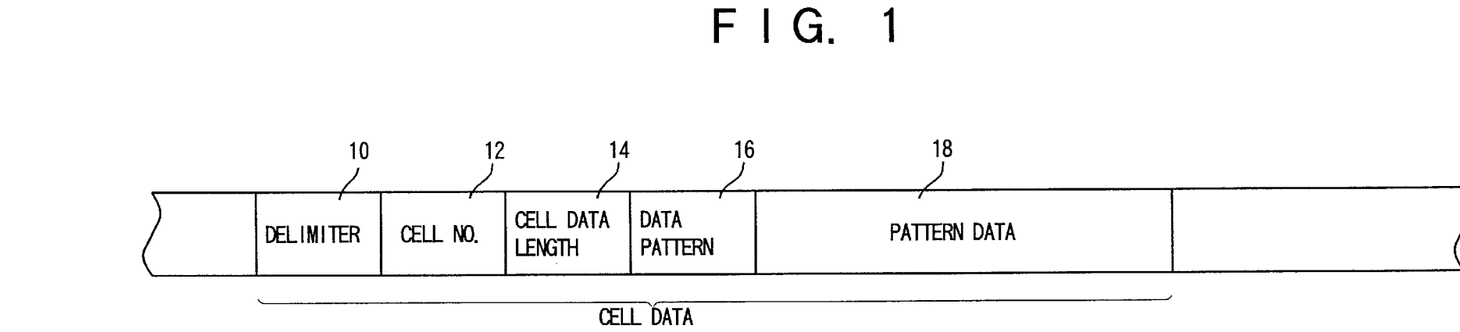
FIG. 1 is a diagram showing a general format of a test data.

FIG. 1 is a diagram showing a general format of a test data used in the present invention. In FIG. 1, the test data is made up of a collection of cell data, and each cell data is formed by a delimiter 10, a cell number 12, a cell data length 14, a data pattern 16, and a pattern data 18.

The delimiter 10 has a fixed pattern which indicates a boundary of two adjacent cell data. The cell number 12 is a sequential number which indicates an order of the cell data, in an ascending or descending order. The cell data length 14 indicates a data length of the entire cell data, by a number of bits, bytes or the like. This cell data length 14 may be omitted if the cell data has a fixed length. The data pattern 16 indicates the kind of pattern of the following pattern data 18, and may be omitted. For example, the data pattern 16 indicates that the following pattern data 18 has a pattern with all "0"s, all "1"s, or the like. The pattern data 18 forms a main body of the test data, and is made up of a repetition of a predetermined number of bits having a fixed pattern or a variable pattern.

Figure 2:
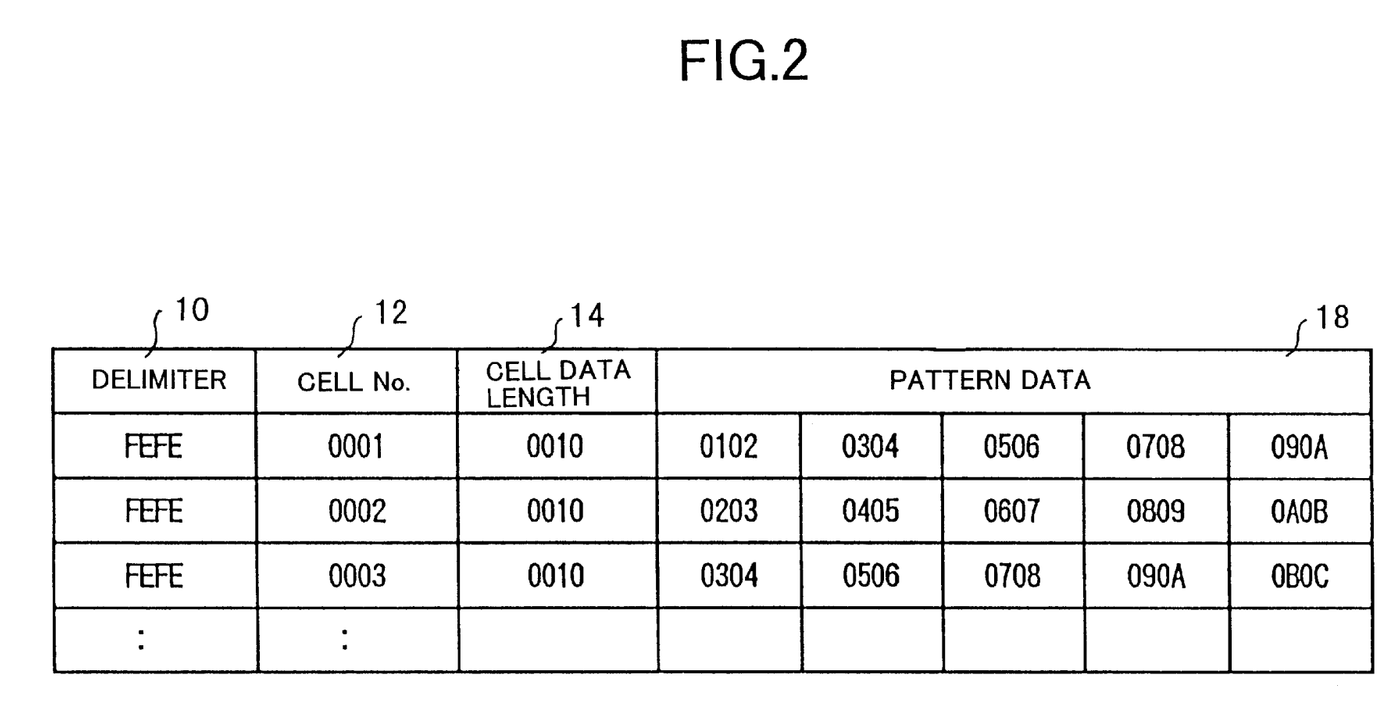
FIG. 2 is a diagram showing an embodiment of the test data.

FIG. 2 is a diagram showing an embodiment of the test data. In FIG. 2, each row corresponds to the cell data, and the values are indicated in hexadecimal. In each cell data, the delimiter 10 has a fixed pattern "FEFE". The cell number 12 of the cell data is a sequential number which starts from "0001" in an ascending order. The cell data length 14 of each cell data is 16 bytes. In this embodiment, the illustration of the data pattern 16 is omitted. The pattern data 18 of each cell data has a sequential numerical value in units of 2 bytes, starting from a numerical value following the cell number 12.

Figure 3:
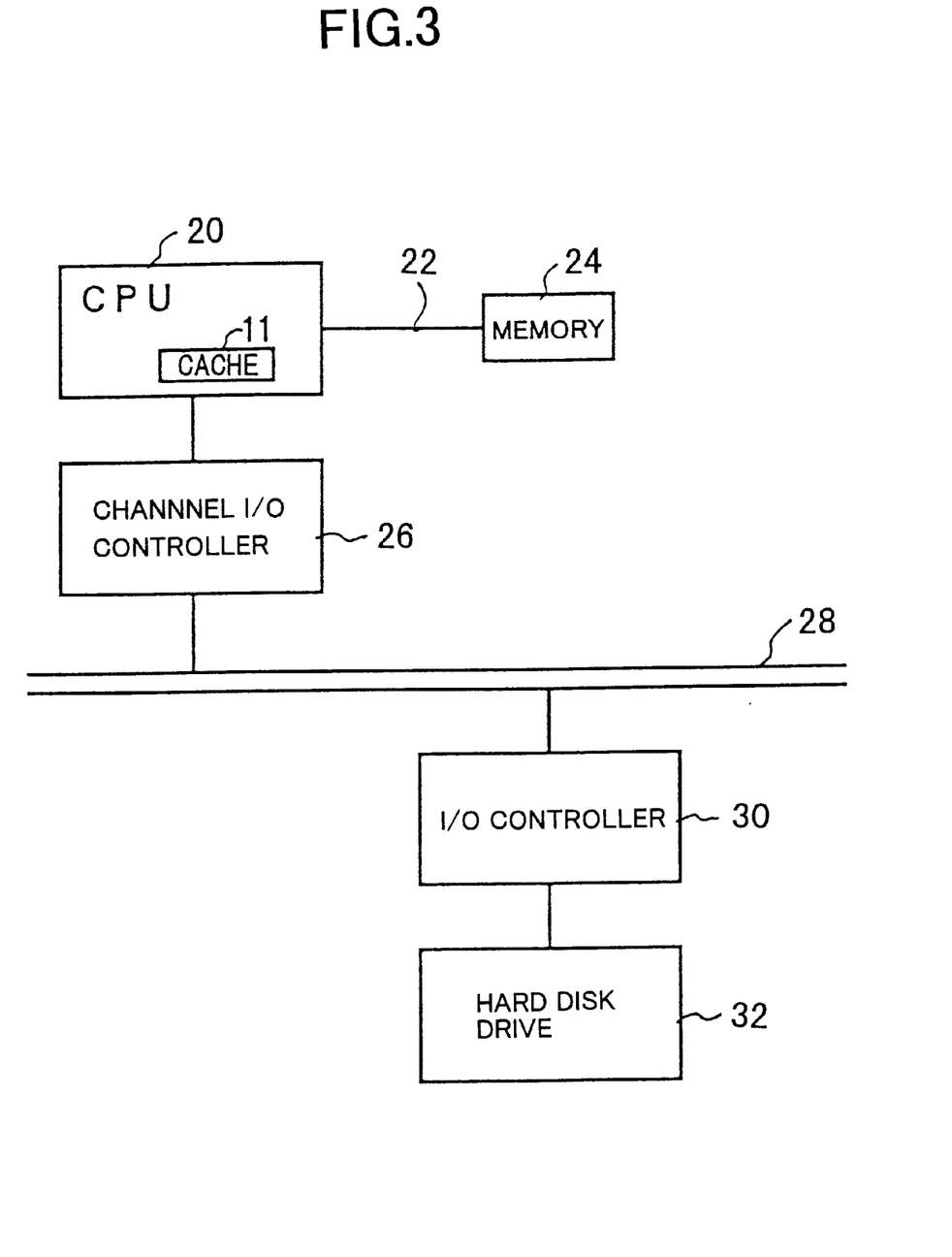
FIG. 3 is a system block diagram showing an information processing apparatus applied with an embodiment of a data inspection method according to the present invention.

FIG. 3 is a system block diagram showing an information processing apparatus applied with an embodiment of a data inspection method according to the present invention, and forms an embodiment of a data inspection apparatus according to the present invention. In FIG. 3, a CPU 20 is connected to a semiconductor memory 24 via an internal bus 22, and a cache 11 is provided within the CPU 20. A channel input/output (I/O) controller 26 is connected to the CPU 20. The channel I/O controller 26 is connected to an external bus 28, and a hard disk drive 32 is connected to the external bus 28 via an input/output (I/O) controller 30.

When the information processing apparatus shown in FIG. 3 makes a write access to the hard disk drive 32, data are read from the memory 24 by the operating system (OS) within the CPU 20, and stored in the cache 11 within the CPU 20 via the internal bus 22. The data stored in the cache 11 are written into one or more disks within the hard disk drive 32, via the channel I/O controller 26, the external bus 28 and the I/O controller 30.

During the write access described above, the data transfer on the internal bus 22 is made in units of 32 bits, for example. In addition, the data are stored in the cache 11 in units of 512 bytes, and the data transfer between the channel I/O controller 26 and the I/O controller 30 is made in units of 256 bytes, for example. Furthermore, in the hard disk drive 32, records are formed in units of 1024 bytes, tracks are formed in units of 6 Kbytes, and cylinders are formed in units of 60 kbytes.

In this embodiment, the cell data length 14 of the cell data forming the test data is variably set depending on the device which is to be tested and the location of the intermediate path which is to be inspected. For example, the cell data length 14 is set to 512 bytes when inspecting the cache 11, and the cell data length 14 is set to 256 bytes when inspecting the intermediate path between the channel I/O controller 26 and the I/O controller 30. The cell data length 14 can freely be changed within each test data.

Figure 4:
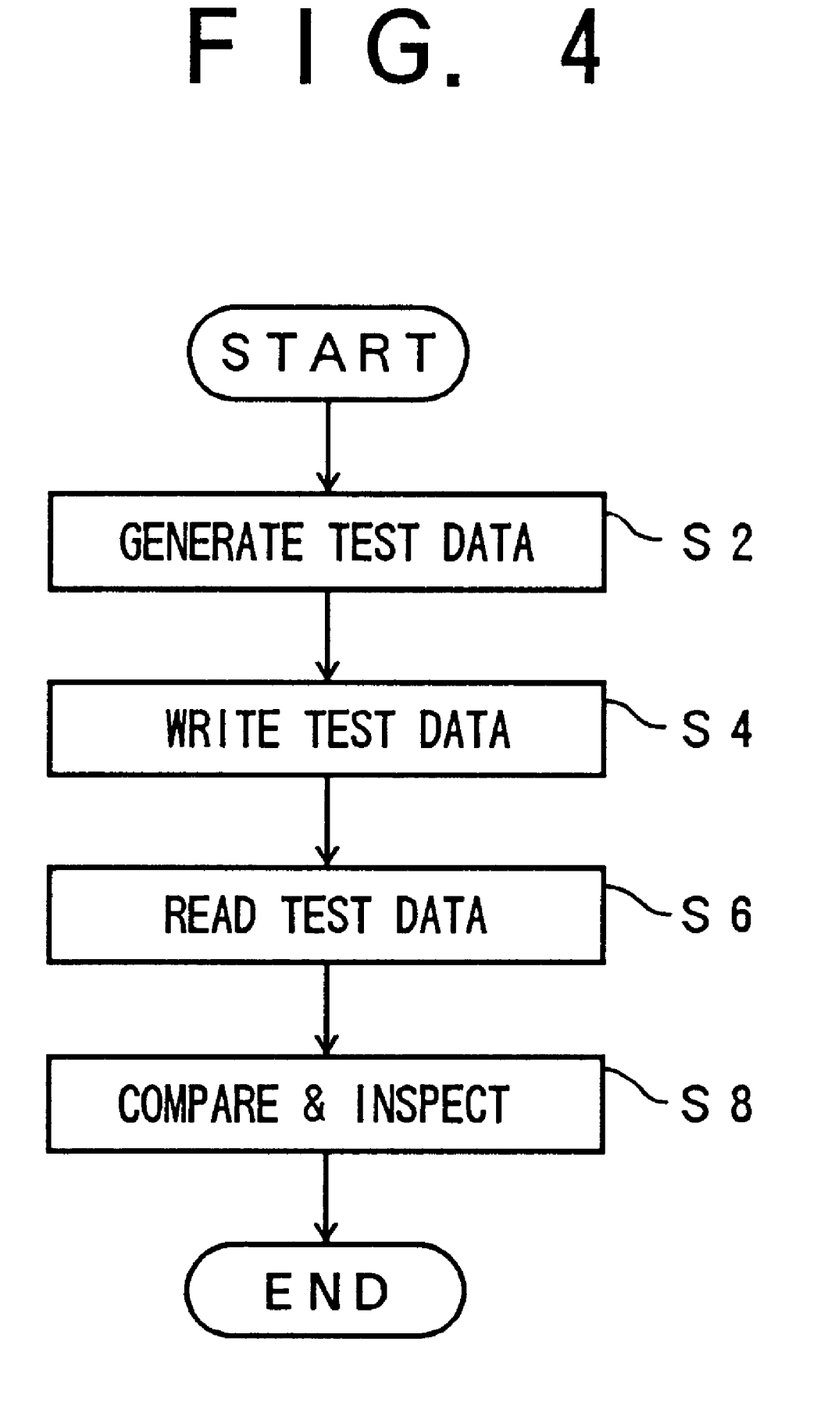
FIG. 4 is a flow chart for explaining a main process of the data inspection method.

FIG. 4 is a flow chart for explaining a main process of this embodiment of the data inspection method. In FIG. 4, a step S2 generates and stores a test data, such as that shown in FIG. 2, depending on the device which is to be tested and the location of the intermediate path which is to be inspected. A step S4 writes the test data to the device which is to be tested, such as the hard disk drive 32. Then, a step S6 reads the written test data from the device which is to be tested. A step S8 carries out a compare and inspect process, and the process ends. The compare and inspect process inspects the read test data, by comparing the read test data and the test data which is stored in the step S2.

Figure 5:
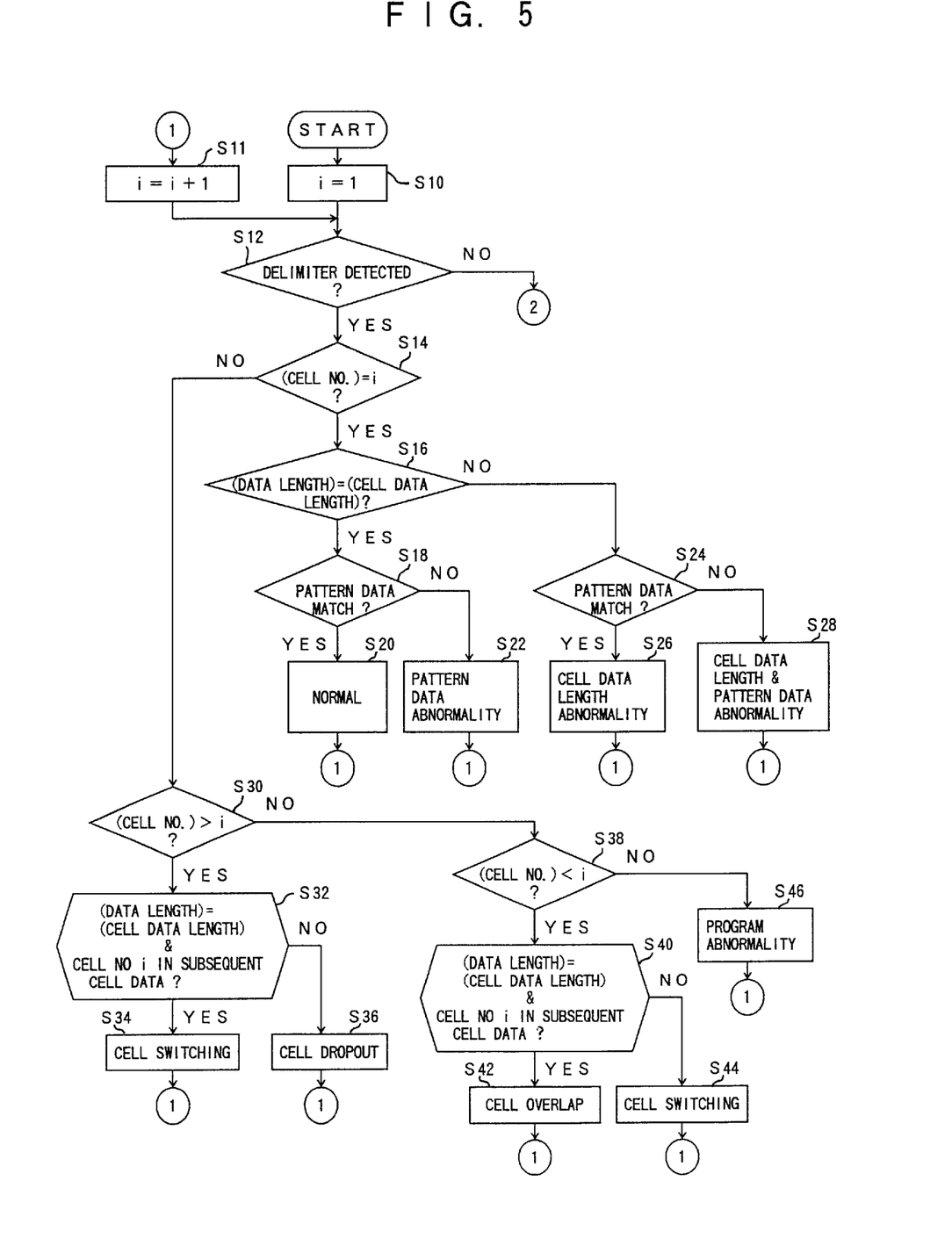
FIG. 5 is a flow chart for explaining a compare and inspect process.
Figure 6:
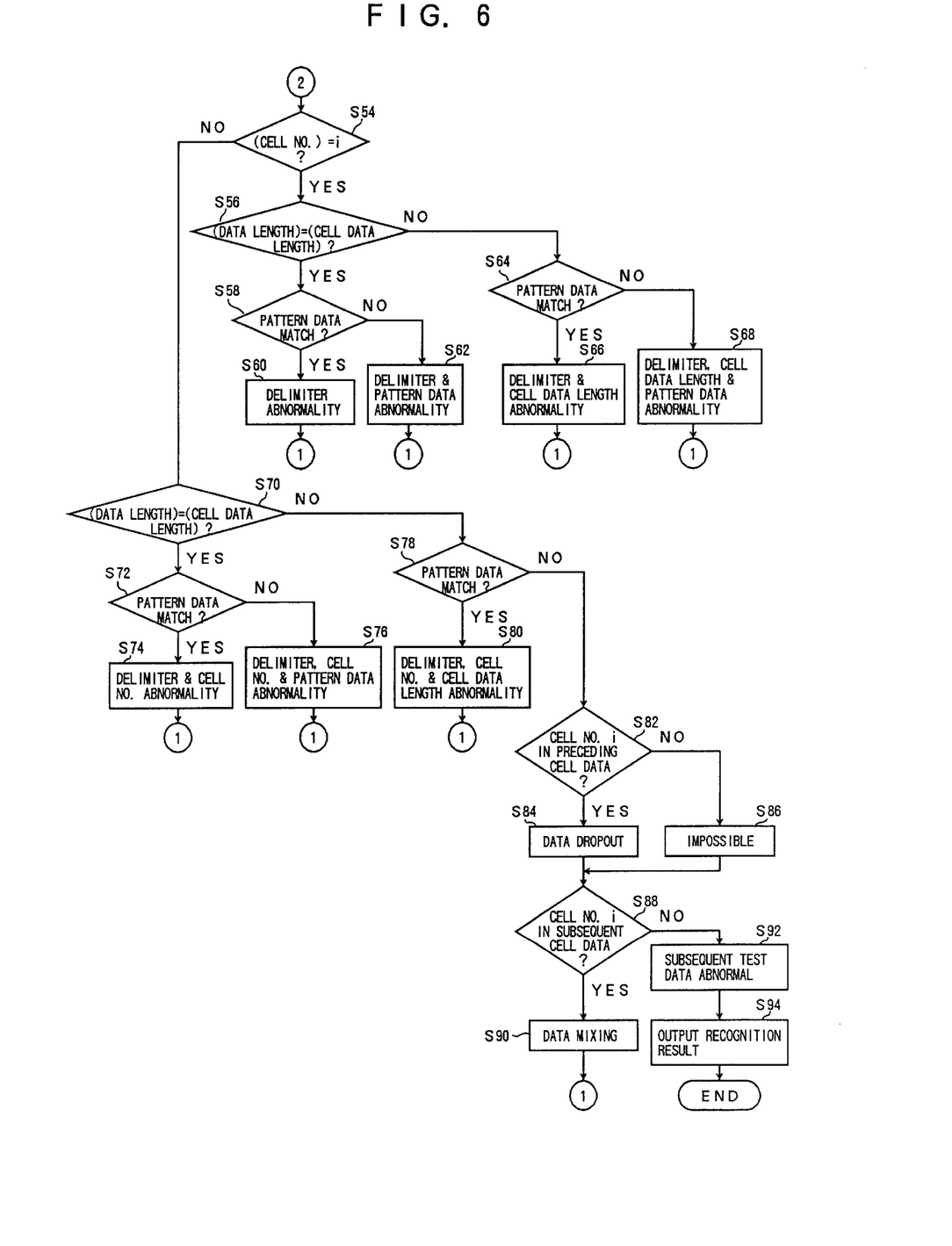
FIG. 6 is a flow chart for explaining the compare and inspect process.
Figure 7:
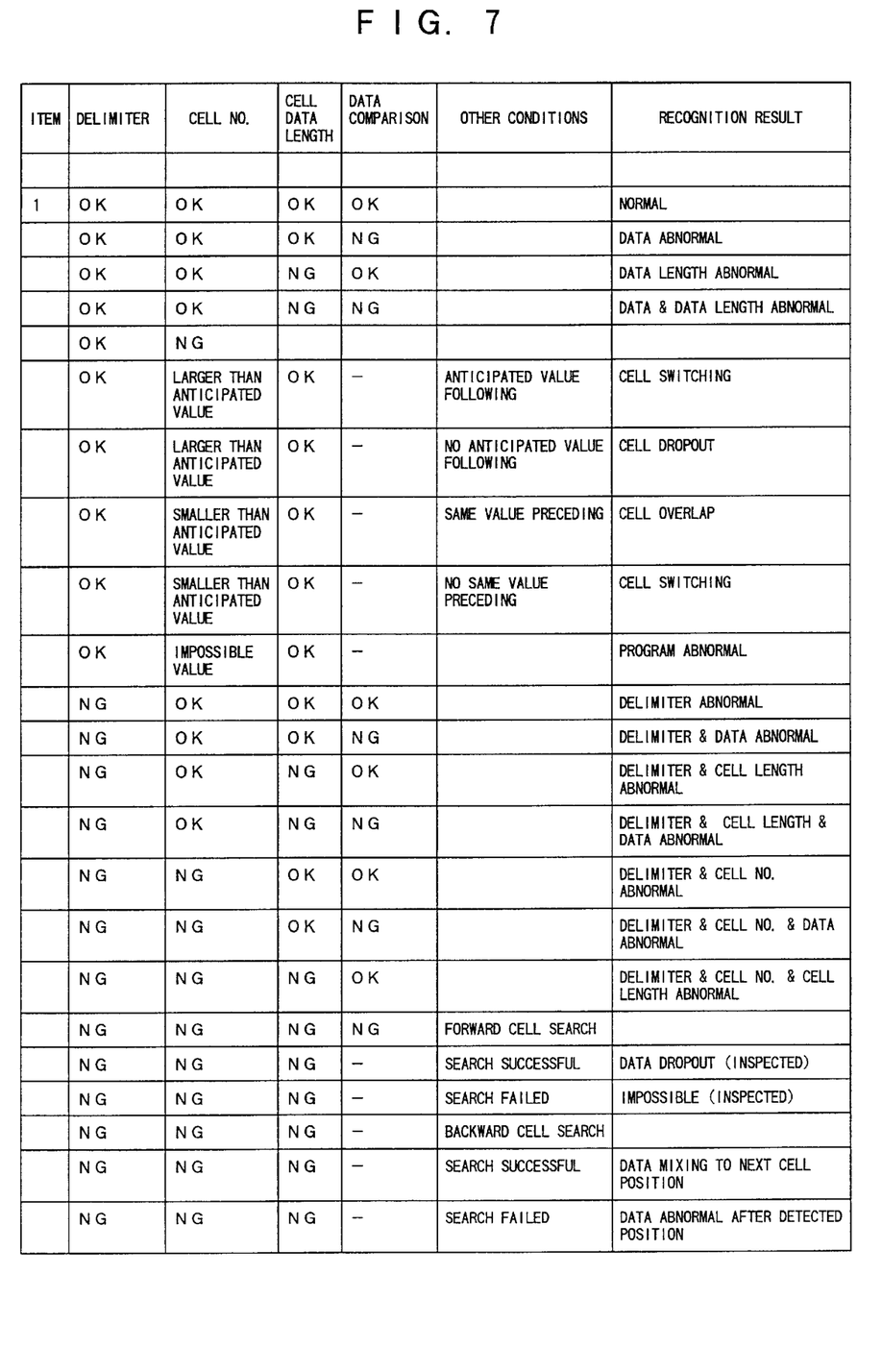
FIG. 7 is a diagram for generally explaining the compare and inspect process.

FIGS. 5 and 6 are flow charts for explaining the compare and inspect process carried out in the step S8 shown in FIG. 4. In addition, FIG. 7 is a diagram for generally explaining the compare and inspect process. In the following description, a device which is to be tested will simply be referred to as a "testing device".

In FIG. 5, a step S10 sets a variable i to 1, and a step S12 decides whether or not the delimiter 10 of the ith cell data is detectable from the test data which is read from the testing device. If the decision result in the step S12 is YES, a step S14 decides whether or not the cell number 12 of the ith cell data has the same value as the variable i and the value of the cell number 12 is correct.

If the decision result in the step S14 is YES, a step S16 decides whether or not the actual data length of the ith cell data matches the cell data length 14 of the ith cell data. If the decision result in the step S16 is YES, a step S18 decides whether or not the pattern data 18 of the ith cell data in the test data read from the testing device matches the pattern data 18 of the ith cell data in the test data which is stored in the step S2 described above. A step S20 recognizes that the ith cell data is normal, if the decision result in the step S18 is YES. On the other hand, a step S22 recognizes that the pattern data 18 of the ith cell data is abnormal, if the decision result in the step S18 is NO.

If the decision result in the step S16 is NO, a step S24 decides whether or not the pattern data 18 of the ith cell data in the test data read from the testing device matches the pattern data 18 of the ith cell data in the test data which is stored in the step S2 described above. A step S26 recognizes that the cell data length 14 of the ith cell data is abnormal, if the decision result in the step S24 is YES. On the other hand, a step S28 recognizes that the cell data length 14 and the pattern data 18 of the ith cell data are abnormal, if the decision result in the step S24 is NO.

The process advances to a step S30 if the decision result in the step S14 is NO. The step S30 decides whether or not the cell number 12 is greater than the variable i. If the decision result in the step S30 is YES, a step S32 decides whether the actual data length of the ith cell data matches the cell data length 14 of the ith cell data, and at the same time, a subsequent cell data has the cell number 12 with the same value as the variable i. A step S34 recognizes that a cell switching abnormality exists if the decision result in the step S32 is yes. In addition, a step S36 recognizes that a cell dropout abnormality exists if the decision result in the step S32 is NO.

On the other hand, if the decision result in the step S30 is NO, a step S38 decides whether or not the cell number 12 of the ith cell data is smaller than the variable i. If the decision result in the step S38 is YES, a step S40 decides whether or not the actual data length of the ith cell data matches the cell data length 14 of the ith cell data, and at the same time, a previously inspected cell data has the cell number 12 with the same value as the variable i. A step S42 recognizes a cell overlap abnormality if the decision result in the step S40 is YES. Further, a step S44 recognizes a cell switching abnormality if the decision result in the step S40 is NO.

If the decision result in the step S38 is NO, the cell number 12 has an impossible value. Hence, a step S46 recognizes a program abnormality if the decision result in the step S38 is NO.

A step S11 increments the variable i by 1 after any of the steps S20, S22, S26, S28, S34, S36, S42, S44 and S46, and the process thereafter advances to the step S12.

On the other hand, if the decision result in the step S12 is NO, the process advances to a step S54 shown in FIG. 6. The step S54 decides whether or not the cell number 12 of the ith cell data is equal to the variable i and the cell number 12 is correct.

If the decision result in the step S54 is YES, a step S56 decides whether or not the actual data length of the ith cell data matches the cell data length 14 of the ith cell data. If the decision result in the step S56 is YES, a step S58 decides whether or not the pattern data 18 of the ith cell data in the test data which is read from the testing device matches the pattern data 18 of the ith cell data in the test data which is stored in the step S2 described above. A step S60 recognizes that the delimiter 10 of the ith cell data is abnormal, if the decision result in the step S58 is YES. On the other hand, a step S62 recognizes that the delimiter 10 and the pattern data 18 of the ith cell data are abnormal, if the decision result in the step S58 is NO.

If the decision result in the step S56 is NO, a step S64 decides whether or not the pattern data 18 of the ith cell data in the test data which is read from the testing device matches the pattern data 18 of the ith cell data in the test data which is stored in the step S2 described-above. A step S66 recognizes that the delimiter 10 and the cell data length 14 of the ith cell data are abnormal, if the decision result in the step S64 is YES. On the other hand, a step S68 recognizes that the delimiter 10, the cell data length 14 and the pattern data 18 of the ith cell data are abnormal, if the decision result in the step S64 is NO.

In addition, the process advances to a step S70 if the decision result in the step S54 is NO. The step S70 decides whether or not the actual data length of the ith cell data matches the cell data length 14 of the ith cell data. If the decision result in the step S70 is YES, a step S72 decides whether or not the pattern data 18 of the ith cell data in the test data which is read from the testing device matches the pattern data 18 of the ith cell data in the test data which is stored in the step S2 described above. A step S74 recognizes that the delimiter 10 and the cell number 12 of the ith cell data are abnormal, if the decision result in the step S72 is YES. A step S76 recognizes that the delimiter 10, the cell number 12 and the pattern data 18 of the ith cell data are abnormal, if the decision result in the step S72 is NO.

If the decision result in the step S70 is NO, a step S78 decides whether or not the pattern data 18 of the ith cell data in the test data which is read from the testing device matches the pattern data 18 of the ith cell data in the test data which is stored in the step S2 described above. A step S80 recognizes that the delimiter 10, the cell number 12 and the cell data length 14 of the ith cell data are abnormal, if the decision result in the step S78 is YES. The abnormalities recognized in the steps S74, S76 and S80 are caused by data transformation.

On the other hand, if the decision result in the step S78 is NO, a step S82 decides whether or not a previously inspected cell data has the cell number 12 with the same value as the variable i. A step S84 recognizes a data dropout abnormality if the decision result in the step S82 is YES. Because the inspection is made in an order starting from the smallest cell number, it is impossible for the decision result of the step S82 to be YES unless a data dropout occurs. Further, a step S86 recognizes an unrecognizable abnormality, if the decision result in the step S82 is NO.

After the step S84 or S86, a step S88 decides whether or not a subsequent cell data has the cell number 12 with the same value as the variable i. A step S90 recognizes a data mixing abnormality up to the next cell data position, if the decision result in the step S88 is YES. On the other hand, if the decision result in the step S88 is NO, a step S92 recognizes that the subsequent test data is. abnormal, and a step S94 outputs a recognition result together with the cell number 12. The process ends after the step S94.

The step S11 shown in FIG. 5 increments the variable i by 1 after any of the steps S60, S62, S66, S68, S74, S76, S80 and S90 shown in FIG. 6, and the process thereafter advances to the step S12.

FIG. 7 shows the decision results of the compare and inspect process shown in FIGS. 5 and 6, with respect to the item, the delimiter 10, the cell number 12, the cell data length 14, the data comparison, other conditions, and the recognition result. In FIG. 7, "OK" indicates satisfactory, and "NG" indicates unsatisfactory or no good.

Figure 8:
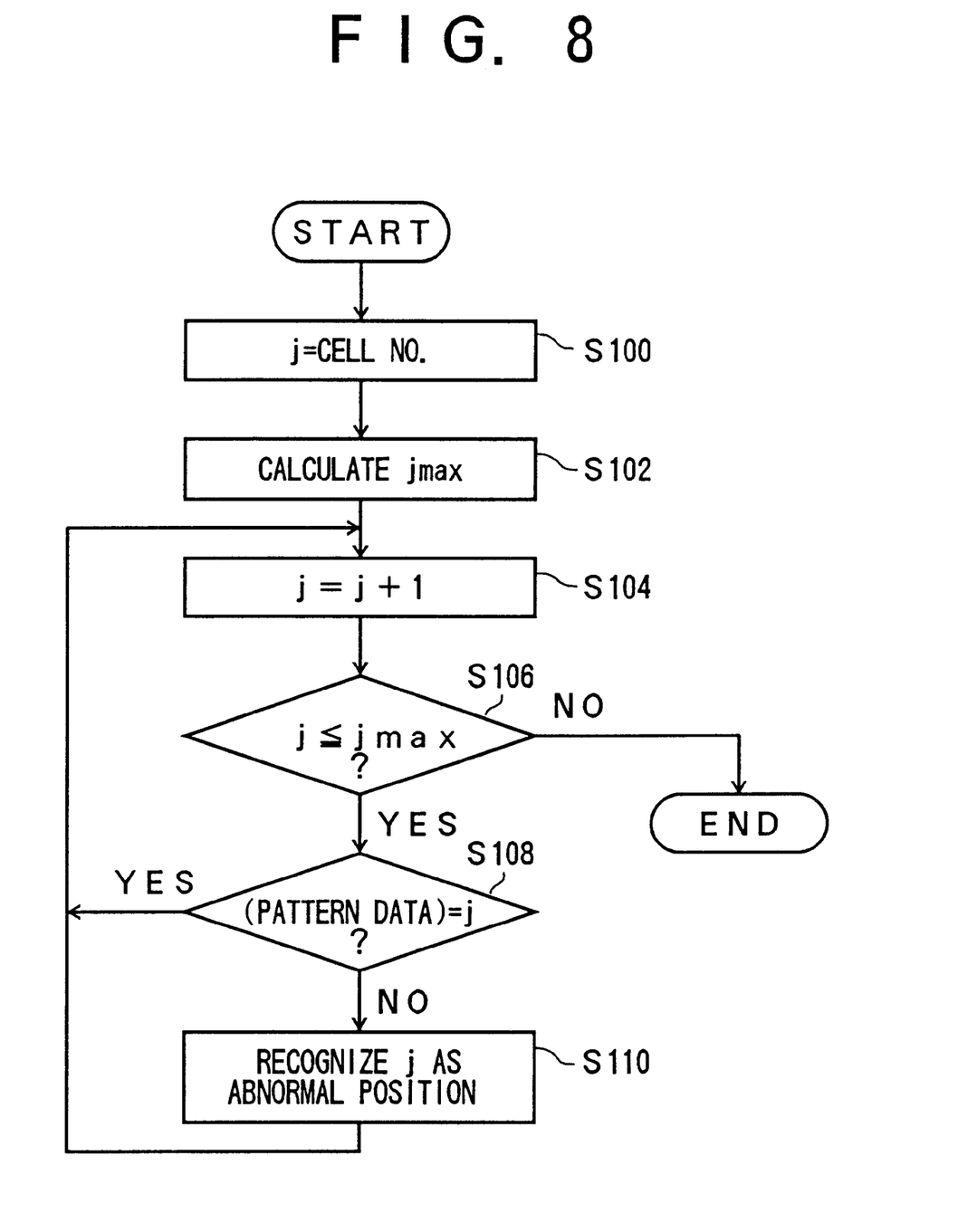
FIG. 8 is a diagram for explaining a routine which is executed when a pattern data abnormality is recognized.

When the step S22 shown in FIG. 5 recognizes that the pattern data 18 of the ith cell data is abnormal, a routine shown in FIG. 8 is carried out to determine in detail the exact location in the pattern data 18 where the abnormality is generated.

In FIG. 8, a step S100 sets the cell number 12 of the ith cell data to a variable j, and a step S102 calculates a sequential number jmax which is included in the pattern data 18, by dividing the number of bytes of the pattern data 18 by 2 bytes. Then, a step S104 increments the variable j by 1. A step S106 decides whether or not the variable j is less than or equal to the sequential number jmax. The process ends if the decision result in the step S106 is NO.

On the other hand, if the decision result in the step S106 is YES, a step S108 decides whether or not the values of the jth and (j+1)th bytes from the start of the pattern data 18 match the value of the variable j. If the decision result in the step S108 is YES, the process returns to the step S104, so as to repeat the above described process to the end of the pattern data 18. On the other hand, a S110 recognizes value of the variable j as being the location of the abnormality, if the decision result in the step S108 is NO. The process returns to the step S104 after the step S110.

Accordingly, it is possible to recognize the exact location in the pattern data 18 where the abnormality is generated. In addition, it is also possible to recognize in detail the amount of data including the abnormality.

The step S2 described above forms a test data generating means. The step S36 forms a data dropout detecting means. The step S42 forms a data overlap detecting means. The steps S34 and S44 form a data switching detecting means. Moreover, the steps S100 through S110 form an abnormality location specifying means.

Further, the present invention is not limited to these embodiments, but various variations and modifications may be made without departing from the scope of the invention.

What is claimed is:

1. A data inspection method comprising:
    writing original test data in a memory region;
    reading the test data from the memory region; and
    comparing the read test data with the original test data to make a data inspection,
    the test data being formed by a plurality of cell data,
    each of the cell data comprising a delimiter indicating a boundary between two adjacent cell data, a cell number indicating an order within the test data, a cell data length indicating a data length of the cell data, and pattern data, and
    each of the cell data in the test data having a cell data length which is variable.

2. The data inspection method as claimed in claim 1, further comprising:
    recognizing a cell data dropout based on a size relationship of a cell number of the cell data in the read test data and an anticipated cell number, and whether or not the read test data includes a cell data having the anticipated cell number, if the cell number of the cell data in the read test data differs from a cell number of the cell data in the original test data.

3. The data inspection method as claimed in claim 1, further comprising:
    recognizing a cell data overlap based on a size relationship of a cell number of the cell data in the read test data and an anticipated cell number, and whether or not the read test data includes a cell data having the anticipated cell number, if the cell number of the cell data in the read test data differs from a cell number of the cell data in the original test data.

4. The data inspection method as claimed in claim 1, further comprising:
    recognizing a cell data switching based on a size relationship of a cell number of the cell data in the read test data and an anticipated cell number, and whether or not the read test data includes a cell data having the anticipated cell number, if the cell number of the cell data in the read test data differs from a cell number of the cell data in the original test data.

5. The data inspection method as claimed in claim 1, further comprising:
    recognizing an abnormality in the cell data of the read test data based on a size relationship of a cell number of the cell data in the read test data and an anticipated cell number, and whether or not the read test data includes a cell data having the anticipated cell number, if the cell number of the cell data in the read test data differs from a cell number of the cell data in the original test data; and
    recognizing a location of the abnormality recognized by said recognizing an abnormality based on the cell number of the cell data in the read test data.

6. A data inspection apparatus which makes a data inspection by writing original test data in a memory region, reading the test data from the memory region, and comparing the read test data with the original test data, comprising:
    test data generating means for generating the test data from a plurality of cell data,
    each of the cell data comprising a delimiter indicating a boundary between two adjacent cell data, a cell number indicating an order within the test data, a cell data length indicating a data length of the cell data, and pattern data,
    each of the cell data in the test data having a cell data length which is variable.

7. The data inspection apparatus as claimed in claim 6, which further comprises:
    data dropout recognizing means for recognizing a cell data dropout based on a size relationship of a cell number of the cell data in the read test data and an anticipated cell number, and whether or not the read test data includes a cell data having the anticipated cell number, if the cell number of the cell data in the read test data differs from a cell number of the cell data in the original test data.

8. The data inspection apparatus as claimed in claim 6, which further comprises:
    data overlap recognizing means for recognizing a cell data overlap based on a size relationship of a cell number of the cell data in the read test data and an anticipated cell number, and whether or not the read test data includes a cell data having the anticipated cell number, if the cell number of the cell data in the read test data differs from a cell number of the cell data in the original test data.

9. The data inspection apparatus as claimed in claim 6, which further comprises:
    data switching recognizing means for recognizing a cell data switching based on a size relationship of a cell number of the cell data in the read test data and an anticipated cell number, and whether or not the read test data includes a cell data having the anticipated cell number, if the cell number of the cell data in the read test data differs from a cell number of the cell data in the original test data.

10. The data inspection apparatus as claimed in claim 6, which further comprises:
    abnormality recognizing means for recognizing an abnormality in the cell data of the read test data based on a size relationship of a cell number of the cell data in the read test data and an anticipated cell number, and whether or not the read test data includes a cell data having the anticipated cell number, if the cell number of the cell data in the read test data differs from a cell number of the cell data in the original test data; and
    location recognizing means for recognizing a location of the abnormality recognized by said abnormality recognizing means based on the cell number of the cell data in the read test data.

11. A data inspection apparatus which makes a data inspection by writing original test data in a memory region, reading the test data from the memory region, and comparing the read test data with the original test data, comprising:
    a test data generating unit generating the test data from a plurality of cell data,
    each of the cell data comprising a delimiter indicating a boundary between two adjacent cell data, a cell number indicating an order within the test data, a cell data length indicating a data length of the cell data, and pattern data, each of the cell data in the test data having a cell data length which is variable.

* * * * *